(12) United States Patent
Hattori et al.

(10) Patent No.: US 10,424,990 B2
(45) Date of Patent: Sep. 24, 2019

(54) INVERTER-INTEGRATED ELECTRIC COMPRESSOR

(71) Applicant: MITSUBISHI HEAVY INDUSTRIES THERMAL SYSTEMS, LTD., Minato-ku, Tokyo (JP)

(72) Inventors: Makoto Hattori, Aichi (JP); Masahiko Asai, Aichi (JP)

(73) Assignee: Mitsubishi Heavy Industries Thermal Systems, Ltd., Tokyo (JP)

( * ) Notice: Subject to any disclaimer, the term of this patent is extended or adjusted under 35 U.S.C. 154(b) by 140 days.

(21) Appl. No.: 14/652,699

(22) PCT Filed: Jan. 8, 2014

(86) PCT No.: PCT/JP2014/050103
§ 371 (c)(1),
(2) Date: Jun. 16, 2015

(87) PCT Pub. No.: WO2014/129215
PCT Pub. Date: Aug. 28, 2014

(65) Prior Publication Data
US 2015/0340933 A1 Nov. 26, 2015

(30) Foreign Application Priority Data
Feb. 20, 2013 (JP) ................. 2013-031408

(51) Int. Cl.
*H02K 5/22* (2006.01)
*H02K 11/02* (2016.01)
(Continued)

(52) U.S. Cl.
CPC ............... *H02K 5/22* (2013.01); *F04B 35/04* (2013.01); *F04B 39/121* (2013.01); *F04B 39/14* (2013.01);
(Continued)

(58) Field of Classification Search
CPC ............ H02K 5/15; H02K 5/22; H02K 5/225; H02K 5/24; H02K 11/00; H02K 11/02;
(Continued)

(56) References Cited

U.S. PATENT DOCUMENTS 3,300,686 A * 1/1967 Johnson ................... G06F 1/18
361/787
6,297,572 B1 * 10/2001 Sunaga ................. H02K 11/33
310/64
(Continued)

FOREIGN PATENT DOCUMENTS

CN 101542873 A 9/2009
CN 102203418 A 9/2011
(Continued)

OTHER PUBLICATIONS

Okochi Yasuyuki, Inverter Integrated Motor Driven Compressor, Jul. 8, 2004, Denso Corp, JP 2004190547 (English Machine Translation).*
(Continued)

*Primary Examiner* — Julio C. Gonzalez
*Assistant Examiner* — Alexander A Singh
(74) *Attorney, Agent, or Firm* — Birch, Stewart, Kolasch & Birch, LLP (57) ABSTRACT

Provided is an inverter-integrated electric compressor which uses the filter circuit as the substrate to eliminate a bulbar connection, improves assembly properties of the inverter device, optimizes the substrate structure, and makes the inverter device more compact and economical. In this inverter-integrated electric compressor, the inverter device is provided with multiple high-voltage electrical components which configure a noise removal filter circuit, a power substrate on which a power element is mounted, a control substrate on which a control circuit is mounted, and a filter circuit substrate which configures the filter circuit by the multiple high-voltage electrical components being connected in a pattern and mounted thereon, wherein the high-voltage electrical components, the power substrate, the control substrate and the filter circuit substrate are config- (Continued)

ured to be so as to be unitized together and housed and arranged in an inverter housing unit.

6 Claims, 5 Drawing Sheets

(51) Int. Cl.
*H02M 7/00* (2006.01)
*F04B 35/04* (2006.01)
*F04B 39/12* (2006.01)
*F04B 39/14* (2006.01)
*H05K 7/14* (2006.01)

(52) U.S. Cl.
CPC ............ *H02K 11/02* (2013.01); *H02M 7/003* (2013.01); *H05K 7/1432* (2013.01)

(58) Field of Classification Search
CPC ........ H02K 11/20; H02K 47/02; H02K 11/33; H02K 7/14; H02K 11/38; H02K 11/23; H02K 7/1432; H05K 7/1432; H02M 7/00; H02M 7/003
USPC ...... 310/71, 72, 68 D, 68 C, 68 R, 68 E, 89; 29/596
See application file for complete search history.

(56) References Cited

U.S. PATENT DOCUMENTS

| | | | |
|---|---|---|---|
| 2007/0231165 A1* | 10/2007 | Koide | F04B 27/0873 417/410.1 |
| 2009/0255704 A1 | 10/2009 | Niwa et al. | |
| 2011/0155414 A1* | 6/2011 | Yasukawa | B29C 45/14065 174/68.2 |
| 2011/0211980 A1* | 9/2011 | Shibuya | F04B 39/121 417/410.1 |
| 2012/0230851 A1* | 9/2012 | Fukasaku | F04C 18/0215 417/411 |
| 2013/0049550 A1 | 2/2013 | Watanabe et al. | |
| 2013/0182397 A1* | 7/2013 | Abe | H05K 3/4629 361/748 |
| 2013/0224050 A1 | 8/2013 | Nakagami et al. | |

FOREIGN PATENT DOCUMENTS

| | | | |
|---|---|---|---|
| EP | 2535587 A1 | | 12/2012 |
| JP | 2004-190547 A | | 7/2004 |
| JP | 2004190547 A | * | 7/2004 |
| JP | 2007-295639 A | | 11/2007 |
| JP | 2009-275606 A | | 11/2009 |
| JP | 2011-135712 A | | 11/2009 |
| JP | 2011-163231 A | | 8/2011 |
| JP | 4898931 B2 | | 3/2012 |
| JP | 2012-120279 A | | 6/2012 |

OTHER PUBLICATIONS

Notice of Granting a Patent Right for Invention issued on Nov. 7, 2016 for corresponding Chinese Application No. 201480003584.6 with an English Translation.

Chinese Office Action and Search Report for Chinese Application No. 201480003584.6, dated Jun. 1, 2016, with an English translation.

* cited by examiner

INVERTER-INTEGRATED ELECTRIC COMPRESSOR

TECHNICAL FIELD

The present invention relates to an inverter-integrated electric compressor in which an inverter device is integrally incorporated into the housing of the electric compressor.

BACKGROUND ART

Inverter-integrated electric compressors in which inverter devices are integrally incorporated are used as air conditioner compressors installed in electric vehicles, hybrid vehicles, and the like. This inverter-integrated electric compressor is configured so that high-voltage direct current power supplied from a power supply unit installed in a vehicle is converted to three-phase alternating current power of a specified frequency, which is then applied to the electric motor so that the electric motor is driven.

An inverter device is, for example, provided on a high-voltage power line from a power supply, and includes high-voltage electrical components, such as a coil, a capacitor, and the like, forming a noise removal filter circuit, a power substrate on which is mounted a switching circuit formed of a plurality of switching elements (power elements), such as IGBT and the like, converting direct current power into three-phase alternating current power, a control substrate on which is mounted a control circuit, such as a CPU or the like, operated at low voltage, a busbar interconnecting the high-voltage electrical components, the power substrate, the control substrate, and the like. The inverter device is configured to convert direct current power input via a P-N terminal into three-phase alternating current power, and to output the power from a UVW terminal.

As the above-described inverter device, Patent Literature 1 discloses an inverter device, where an integrated inverter module is disposed, provided with an intelligent power module (IPM) and a control substrate on a metal base plate, in an inverter box provided on a housing side, a noise removal filter circuit is provided, formed by a high-voltage electrical component, such as a coil, a capacitor, or the like, being mounted on a resin substrate, inside a junction box provided on a top surface of the inverter box, the inverter box is sealed by covering the top surface of the inverter box with the junction box as a cover member, and the filter circuit and the P-N terminal of the IPM are connected by the busbar.

Also, Patent Literature 2 discloses an inverter device, where a power conversion substrate having a coil, a capacitor, a switching element, and the like mounted thereon is fixed and installed, via a fixing tool such as a bolt, a nut, or the like, on an inner surface side of a substrate cover covering an inverter housing section provided on a housing side, via a cover-side resilient member, and the substrate cover is fixed and installed relative to the housing so that the coil and capacitor are disposed in an insertion recess on the housing side and the switching element is disposed on an element-facing surface on the housing side.

CITATION LIST

Patent Literature

Patent Literature 1: Japanese Patent No. 4898931B
Patent Literature 2: Japanese Unexamined Patent Application Publication No. 2009-275606A

SUMMARY OF INVENTION

Technical Problem

Patent Literature 1 listed above discloses the configuration where the filter circuit of the inverter device is formed by a coil and a capacitor being mounted on a resin substrate, and the filter circuit substrate is provided on the junction box side, and another IPM and control substrate are also provided on the inverter box side, so that the configuration has an electrical connection therebetween through the busbar assembly.

As such, it is required that the plurality of high-voltage electrical components and the filter circuit substrate having the components mounted thereon, and the inverter module formed of the IPM and the control substrate that form the inverter device, be separately assembled, integrally joined, and electrically interconnected by the busbar assembly. In such circumstances, a problem arises in that an increase in the number of components and of assembly workload, an increase in manufacturing costs due to increased complexity, and a decrease in productivity, or the like. Moreover, the filter circuit substrate, the control substrate, and the substrate forming the IPM each need to be a separately structured substrate, which makes effective manufacturing of the substrates more difficult, and poses a problem in that cost increases become difficult to be avoided, or the like.

Meanwhile, Patent Literature 2 discloses an inverter device, where the inverter device is collectively assembled on a substrate cover side, then is joined onto the housing side of the electric compressor, and is provided, on one power conversion substrate, a filter circuit having a coil and a capacitor mounted thereon, a switching circuit having a switching element mounted thereon, and a control circuit controlling the filter circuit and the switching circuit. Accordingly, it is expected that the configuration is simplified through the reduced number of components, assembly is made easier, cost decreases, and the like, but conversely, the power conversion substrate unavoidably increases in size. Thus, the inverter housing section is enlarged, leading to a problem in that the compressor is made larger.

Moreover, although the power conversion substrate is made into a large substrate including both a high-voltage area and a low-voltage area, current density corresponding to high voltage must be ensured. Thus, an expensive substrate corresponding high voltage must be used as the substrate; therefore, problems arise that part of the substrate becomes under an excessive specification, which results in waste and prevents cost reduction as expected, and the like.

In light of these circumstances, an object of the present invention is to provide an inverter-integrated electric compressor eliminating the busbar connection by using a filter circuit as a substrate, making assembly of the inverter device easier, optimizing the substrate constitution, and making the inverter device more compact and economical.

Solution to Problem

The inverter-integrated electric compressor of the present invention employs the following means to solve the above problems.

That is, an inverter-integrated electric compressor in accordance with the present invention has an inverter device incorporated into and integrated with an inverter housing section, the inverter housing section being provided on an outer circumference of a housing. In such an inverter-integrated electric compressor, the inverter device includes:

a plurality of high-voltage electrical components forming a noise removal filter circuit; a power substrate having a power element mounted thereon, a control substrate having a control substrate mounted thereon; and a filter circuit substrate having the plurality of high-voltage electrical components connected to a pattern and mounted thereon so as to form the filter circuit. The plurality of high-voltage electrical components, the power substrate, the control substrate, and the filter circuit substrate are integrally unitized, and housed and installed in the inverter housing section.

According to this configuration, the noise removal filter circuit formed by the plurality of high-voltage electrical components such as a capacitor, a coil, and the like being connected onto the high-voltage power line is formed by the plurality of high-voltage electrical components being connected to a pattern on the filter circuit substrate, and the filter circuit substrate is integrally unitized with the plurality of high-voltage electrical components, the power substrate, and the control substrate and is incorporated into the inverter housing section of the housing, thereby enabling the inverter-integrated electric compressor to be assembled. Accordingly, the filter circuit substrate and the power substrate of the high-voltage system are separate substrates from the control substrate, enabling the substrates to ensure current density corresponding to high voltage. In addition, this eliminates a busbar connection between the components forming the filter circuit, welding thereof, and the like, and realizes simplification of assembly, reduced man-hours and reduced manufacturing costs due thereto, which in turn makes it possible to improve productivity. Moreover, reducing the number of components enables the inverter device to be made smaller and compact, which in turn enables the inverter-integrated electric compressor to be made more compact and lightweight.

In addition, in the above-described inverter-integrated electric compressor, it is preferable that the inverter device include a resin structure integrally formed with a housing section for the plurality of high-voltage electrical components and an assembly section for the substrates, in which the plurality of high-voltage electrical components are housed and installed in the housing section of the resin structure, the power substrate is assembled on a bottom surface side of the assembly section of the resin structure, the control substrate is assembled on a top surface side of the assembly section of the resin structure, and the filter circuit substrate is assembled on a top surface side of the housing section of the resin structure having the plurality of high-voltage electrical components housed and installed therein, so that inverter device is integrally unitized.

Thus, this configuration enables the inverter device integrally unitized via the resin structure to be integrally incorporated into the electric compressor by tightly fixing the resin structure to the inverter housing section with screws or the like, or enables the entire inverter device to be removed from the inverter housing section by removing the screws. Consequently, this enables the assembly or maintenance of the inverter device to be simplified and facilitated.

In addition, it is preferable that, in the above-described inverter-integrated electric compressor, the inverter device include a UVW busbar configured to output power converted into three-phase alternating current power by the unitized inverter device to an electric motor side via a glass-sealed terminal.

According to this configuration, the power converted into three-phase alternating current power of the specified frequency by the unitized inverter device is output from the UVW busbar to the glass-sealed terminal, so that the power can be applied to the electric motor housed within the housing. Accordingly, such interposition of this UVW busbar ensures a degree of freedom in terms of layout between the output position of the unitized inverter device and the glass-sealed terminal provided within the inverter housing section, so that design can be simplified.

In addition, in any of the above-described inverter-integrated electric compressors, it is preferable that the power substrate and the filter circuit substrate be substrates having a common structure able to ensure current density corresponding to high voltage.

Thus, this configuration allows the filter circuit substrate and the power substrate, which are substrates of the same high-voltage system provided on the high-voltage line and have a large quantity of electricity corresponding to high voltage flow therethrough, to be substrates having a common structure. Accordingly, the substrate material used for the power substrate is applicable as-is for the filter circuit substrate, which enables a reduction in manufacturing costs for the filter circuit substrate.

In addition, in the above-described inverter-integrated electric compressor, it is preferable that the power substrate and the filter circuit substrate be multi-layer structured substrates.

According to this configuration, employing the multi-layer structured substrates as the power substrate and the filter substrate of the high-voltage system enables sufficient current density corresponding to high voltage to be ensured on each substrate. Consequently, sufficient thermal resistance is ensured even in use under environment in which heat is generated by high voltage and large current or environment of high temperature.

In addition, in any of the above-described inverter-integrated electric compressors, it is preferable that the power substrate and the filter circuit substrate be created from a common substrate material and be formed by the common substrate material being divided or split.

According to this configuration, taking two substrates from the common substrate material enables the power substrate and the filter circuit substrate of the high-voltage system to be manufactured as a set. Accordingly, the power substrate and the filter circuit substrate are efficiently manufactured, enabling cost reduction.

Advantageous Effects of Invention

According to the present invention, the noise removal filter circuit formed by the plurality of high-voltage electrical components such as a capacitor, a coil, and the like being connected onto the high-voltage power line is formed by the plurality of high-voltage electrical components being connected to a pattern on the filter circuit substrate, and the filter circuit substrate is integrally unitized with the plurality of high-voltage electrical components, the power substrate, and the control substrate and is incorporated into the inverter housing section of the housing, thereby enabling the inverter-integrated electric compressor to be assembled. Thus, the filter circuit substrate and the power substrate of the high-voltage system are separate substrates from the control substrate, enabling the substrates to ensure current density corresponding to high voltage. In addition, this eliminates a busbar connection between the components forming the filter circuit, welding thereof, and the like, and realizes simplification of assembly, reduced man-hours and reduced manufacturing costs due thereto, which in turn makes it possible to improve productivity. Also, reducing the number of parts enables the inverter device to be made smaller and compact, which in turn enables the inverter-integrated electric compressor to be more compact and lightweight.

DESCRIPTION OF EMBODIMENTS

An embodiment of the present invention is described below with reference to FIGS. 1 to 5.

Figure 1:
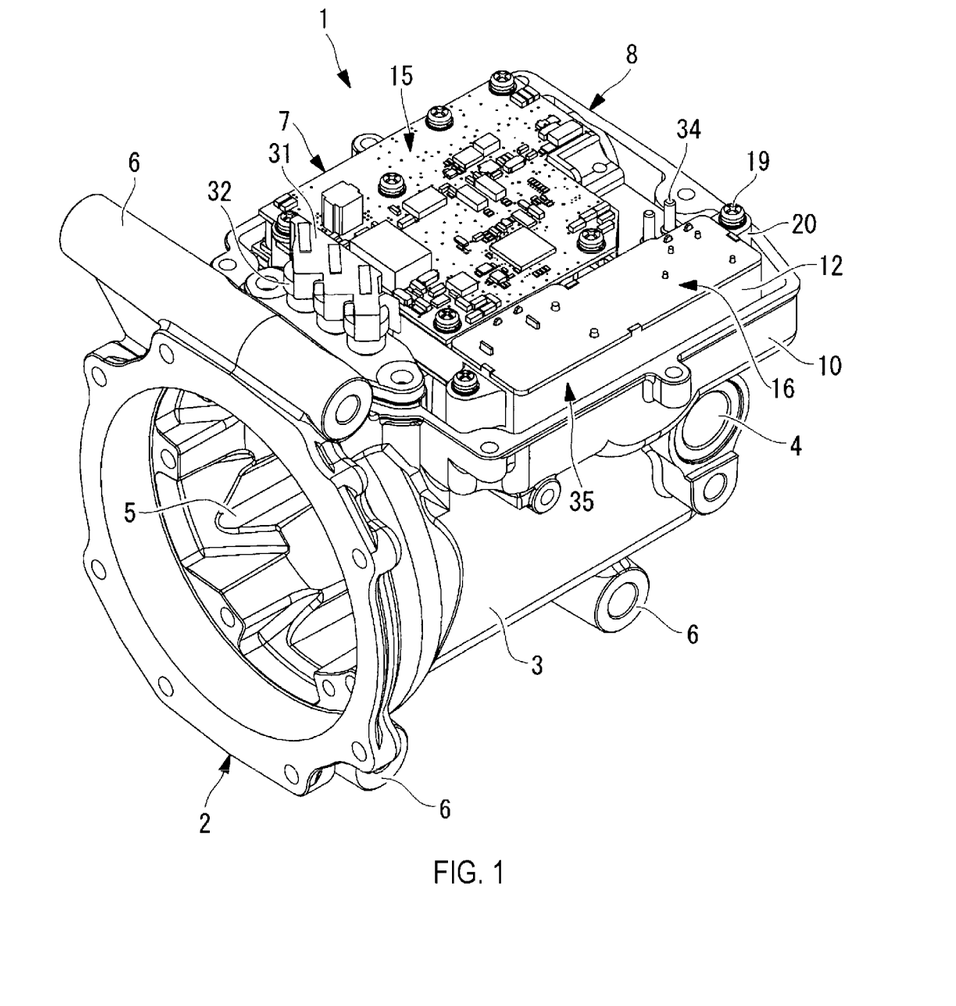
FIG. 1 is a perspective view of a main portion of an inverter-integrated electric compressor according to an embodiment of the present invention.
Figure 2:
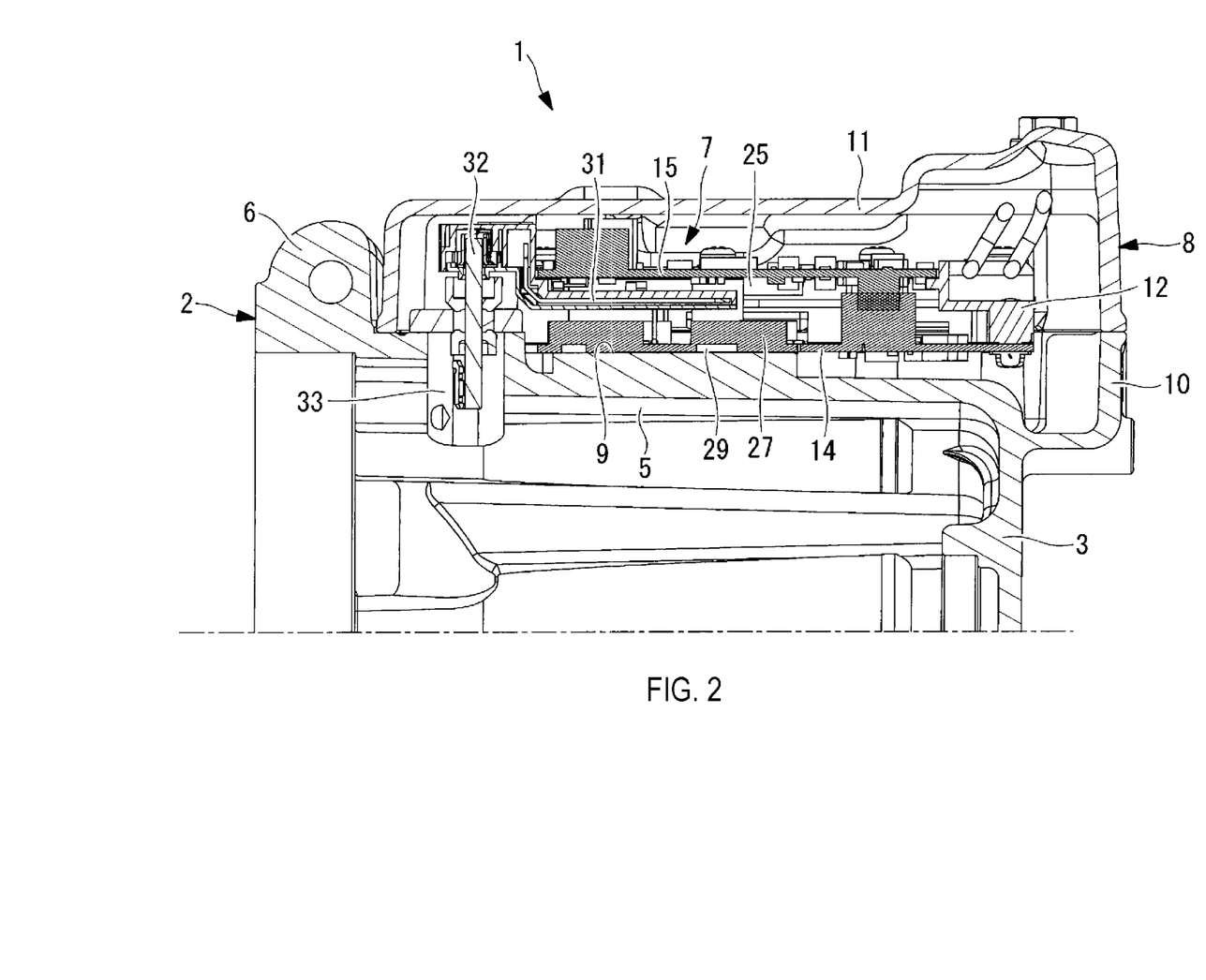
FIG. 2 is a longitudinal cross-sectional view along an axis of a motor housing of the inverter-integrated electric compressor.
Figure 3:
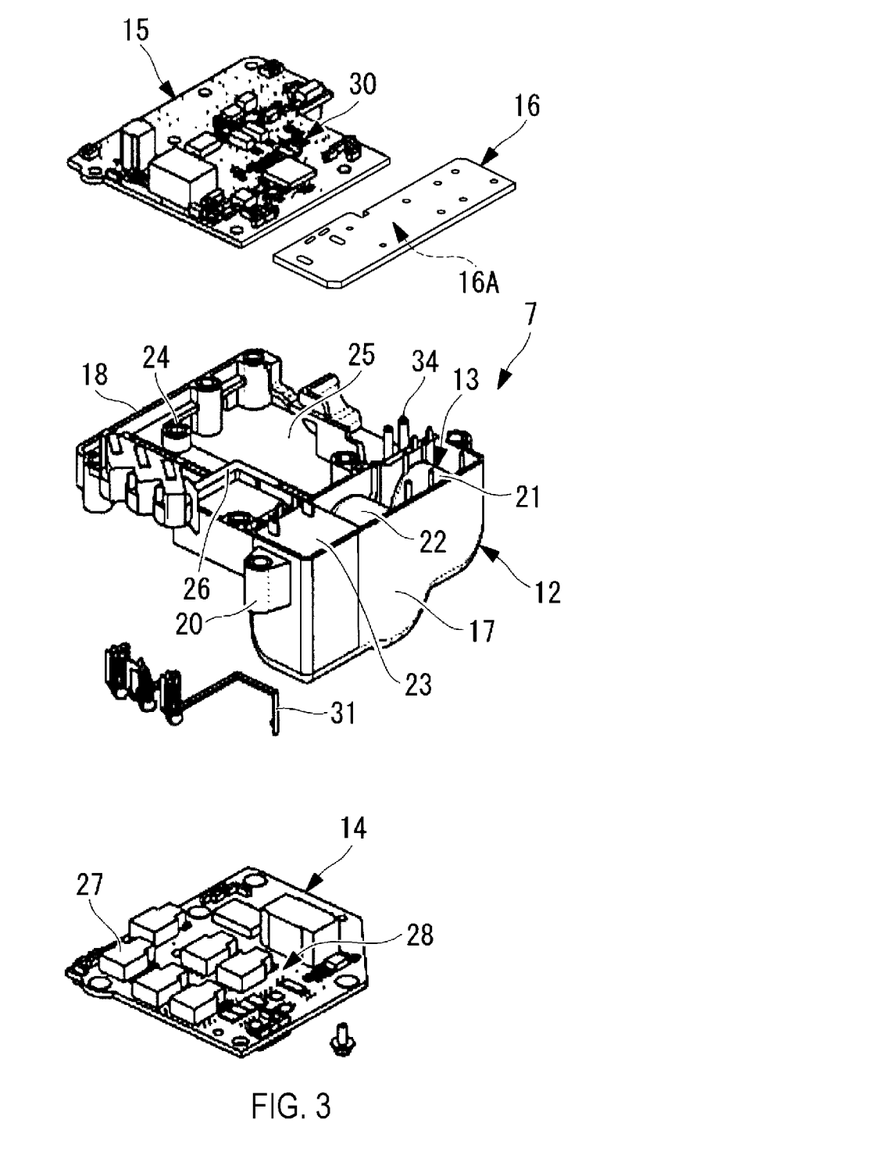
FIG. 3 is an exploded perspective view of an inverter device to be incorporated in the inverter-integrated electric compressor.
Figure 4:
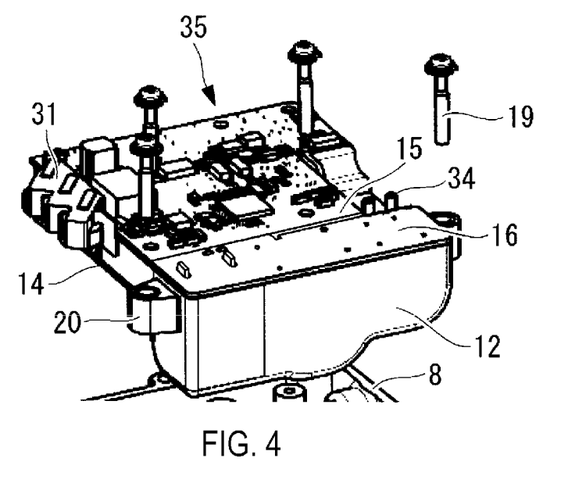
FIG. 4 is a perspective view of the inverter device in an assembled state.

FIG. 1 depicts a perspective view of the main portion of an inverter-integrated electric compressor in accordance with an embodiment of the present invention, FIG. 2 depicts a longitudinal cross-sectional view along an axis direction of a motor housing, FIG. 3 depicts an exploded perspective view of an inverter device, and FIG. 4 depicts a perspective view thereof in an assembled state.

The inverter-integrated electric compressor 1 is provided with a cylindrical housing 2 that forms an outer shell. The housing 2 includes a motor housing 3 for housing an electric motor (not illustrated), and a compressor housing (not illustrated) for housing a compression mechanism (not illustrated), which are integrally joined.

The inverter-integrated electric compressor 1 is configured so that the electric motor and the compression mechanism housed in the housing 2 are linked via a rotary shaft, and the compression mechanism is driven by the electric motor being rotationally driven via an inverter device 7 described below, whereby a low-pressure refrigerant gas drawn into the interior of the motor housing 3 via an intake port 4 disposed in a side wall on a rear end side of the motor housing 3 is drawn in through the periphery of the electric motor, compressed to a high pressure by the compression mechanism, and discharged inside the compressor housing, and then sent outside.

The motor housing 3 has a plurality of refrigerant flow paths 5 formed in the inner peripheral surface thereof to allow refrigerant to flow along an axial direction, and has a plurality of legs 6 for mounting the electric compressor 1 provided on the outer circumference thereof. An inverter housing section 8 is also integrally formed on the outer circumference of the housing 2 (on the motor housing 3 side) for integrally incorporating the inverter device 7. The inverter housing section 8 is configured so as to have an approximately square shape in a plan view, to have a bottom surface thereof form a partially substantially flat pedestal surface 9 formed by a wall surface of the motor housing 3, and to have a flange portion 10 erected on the periphery thereof.

The inverter housing section 8 is configured so as to be sealed by a cover 11 being mounted on the flange section 10, as illustrated in FIG. 2, after the inverter device 7 is incorporated. As publicly known, connected to the cover 11 via a connector (not illustrated) is a high-voltage cable from a power supply unit installed in a vehicle, and the connector is connected to a P-N terminal 34 (see FIG. 1) provided on the inverter device 7 side. Accordingly, the inverter device 7 is configured to have high-voltage direct current applied thereto.

The inverter device 7 converts the high-voltage direct current power supplied via the high-voltage cable from the power supply unit installed in the vehicle into three-phase alternating current power of a specified frequency and then applies the three-phase alternating current power to the electric motor, which drives the electric motor. As illustrated in FIG. 3, the inverter device 7 is configured to include a resin structure 12, a plurality of high-voltage electrical components 13 housed and installed in the resin structure 12, a power substrate 14 assembled on a bottom surface side of the resin structure 12, a control substrate 15 assembled on a top surface side of the resin structure 12, and a filter circuit substrate 16 assembled on a top surface side of a housing section of the resin structure 12 where the high-voltage electrical components 13 are housed and installed. The inverter device 7 is also provided with a UVW busbar 31 configured to output the three-phase alternating current power converted by the inverter device 7 toward the electric motor.

The resin structure 12 is configured to integrally unitize the inverter device 7. The resin structure 12 is a structure in which a housing section 17 having a bottom and a volume required for housing and installing the plurality of high-voltage components 13 and a frame-like assembly section 18 for assembling the power substrate 14 and the control substrate 15 are integrally resin-molded. The housing section 17 is formed on one side of the assembly section 18, i.e., formed in correspondence with the surface on the outer circumference side of the motor housing 3 in which the intake port 4 is disposed. A plurality of legs 20 are integrally formed on the periphery of the housing section 17 and assembly section 18 for tightly fixing the unitized inverter device 7 via screws 19 (see FIG. 1) after the inverter device 7 is housed in the inverter housing section 8.

As described below, the housing section 17 is configured to house and install the plurality of high-voltage electrical components 13 mounted on the filter circuit substrate 16, such as a common mode coil 21, a normal mode coil 22, a smoothing capacitor 23, and the like, which form a noise removal filter circuit 16A. The housing section 17 is shaped to have a housing space corresponding to the contours of the plurality of coils 21, 22, which are circular, and of the capacitor 23, which is polygonal, so that the plurality of high-voltage electrical components 13 are fixed and installed within the housing section 17 via an adhesive or the like.

The assembly section 18 is integrally formed on one side of the housing section 17, and forms a frame-like assembly body with a height dimension to ensure a specified distance between the power substrate 14 and the control substrate 15, the two substrates being placed one above the other. Multiple assembly bosses 24 are provided on the inner periphery of the assembly section 18 to assemble the power substrate 14 and the control substrate 15, with an empty space 25 being provided in a center portion of the assembly section 18. Additionally, a support 26 for the control substrate 15 is integrally formed in the assembly section 18, extending in an L-shape toward the center portion of the empty space 25 from one corner of the assembly section 18.

Here, in the resin structure 12, connection terminals for electrically connecting the P-N terminal 34 and the filter circuit substrate 16, connecting the filter circuit substrate 16 and the power substrate 14, and connecting the power substrate 14 and the control substrate 15 are insert-molded in advance.

The power substrate 14 is a substrate on which a switching circuit 28 or the like, constituted by a plurality (six) of switching elements (power elements) such as IGBT that convert direct current power to three-phase alternating current power, is mounted. The power substrate 14 is configured to be assembled by being tightly fixed via screws or the like to the assembly bosses 24 provided on the bottom surface side of the assembly section 18 of the resin structure 12.

Figure 5:
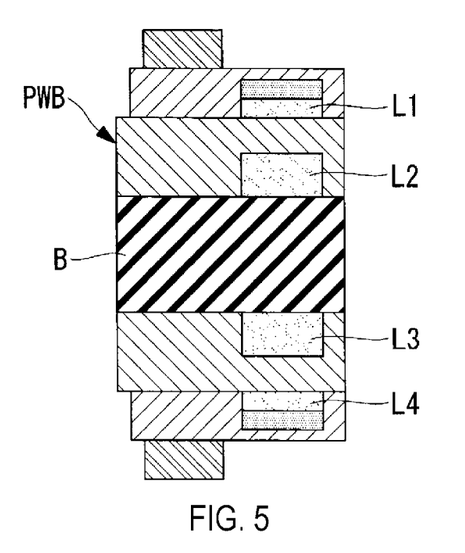
FIG. 5 is a schematic cross-sectional view of a substrate having a four-layer structure to be applied to a power substrate and a filter circuit substrate of the inverter device.

Moreover, as illustrated in FIG. 5, the power substrate 14 is, for example, a multi-layer structured substrate PWB such as a substrate having four-layer structure or the like, which has four layers L1 to L4 of copper foil disposed with respect to a core member B and is capable of ensuring current density corresponding to high voltage. The power substrate 14 is provided with a heat-through section 29 (see FIG. 2) made of a thermally conductive material such as copper and disposed at a location corresponding to the heat-generating power element 27, and is able to conduct heat from a front surface side to a rear surface side of the substrate, effectively being a copper inlay substrate.

The heat-through section 29 in the power substrate 14 is configured so that, once the unitized inverter device 7 is housed and installed in the inverter housing section 8, as illustrated in FIG. 2, the bottom surface of the inverter device 7 comes into contact with the substantially flat pedestal surface 9 of the motor housing 3 that forms the bottom surface of the inverter housing section 8, and heat generated by the power element 27 is dissipated via the heat-through section 29 to the pedestal surface 9 of the motor housing 3, thereby enabling cooling of the power element 27 with the pedestal surface 9 acting as a heat sink. Note that the pedestal surface 9 of the motor housing 3 is able to function sufficiently as a heat sink, as described above, because the pedestal surface 9 is cooled by low-pressure refrigerant gas that has been drawn in from the intake port 4 flowing through the refrigerant flow paths 5.

The control substrate 15 on which a control circuit 30 that operates under low voltage, such as a CPU, is mounted and serves to control operations of the inverter device 7 by control signals from an ECU mounted on the vehicle side. The control substrate 15 is assembled on the top surface of the assembly section 18 of the resin structure 12 by being tightly fixed to the assembly bosses 24 with screws or the like. The center portion of the control substrate 15 is supported from below via the support 26 formed integrally with the assembly section 18, thereby providing improved vibration resistance. Note that the control substrate 15 may be screwed to the support 26.

The filter circuit substrate 16 forms a high-voltage power line leading the direct current power input to the P-N terminal 34 to the power substrate 14, and has the plurality of high-voltage electrical components 13 such as the common mode coil 21, the normal mode coil 22, the smoothing capacitor 23 and the like mounted thereon by connecting, i.e., soldering or brazing, their terminals to a pattern, thereby forming the filter circuit 16A as publicly known. The filter circuit substrate 16 is configured to be assembled and fixed on the top surface side of the housing section 17 for the high-voltage electrical components 13 in the resin structure 12.

Moreover, it is required that the filter circuit substrate 16 be a substrate capable of ensuring current density corresponding to high voltage. Thus, similar to the power substrate 14 and as illustrated in FIG. 5, a multi-layer structured substrate PWB, such as a substrate having a four-layer structure in which four layers L1 to L4 of copper foil are provided, is used. The filter circuit substrate 16 and the power substrate 14 use a common multi-layer structured substrate PWB. As such, taking two substrates from the common substrate material enables the filter circuit substrate 16 and the power substrate 14 to be manufactured as a set, and enables the filter circuit substrate 16 and the power substrate 14 to be formed by the common substrate material being divided or split.

The UVW busbar 31 is configured to output the three-phase alternating current power from the inverter device 7 toward the electric motor. The UVW busbar 31 is configured so as to be arranged using the empty space 25 between the power substrate 14 and control substrate 15, which sandwich the assembly section 18 of the resin structure 12 from above and below, as illustrated in FIG. 2. The UVW busbar 31 is connected to a glass-sealed terminal 32 disposed within the inverter housing section 8, passing through the housing 2 (motor housing 3). Accordingly, the UVW busbar 31 is configured to be electrically connected to the electric motor via a cluster block 33 to which the glass-sealed terminal 32 is connected.

The P-N terminal 34 is disposed on the resin structure 12 side so as to protrude above the filter circuit substrate 16, and enables the connector on the high-voltage cable side provided on the cover 11 side to be inserted thereto. The P-N terminal 34 is configured to be connected to the high-voltage power line formed by the wiring pattern of the filter circuit substrate 16.

As described above, the inverter device 7 is made into a unitized inverter unit (unit) 35 by assembling the plurality of high-voltage electrical components 13 such as the common mode coil 21, the normal mode coil 22, the smoothing capacitor 23, and the like which are components of the inverter device 7, the power substrate 14, the control substrate 15, the filter circuit substrate 16 formed by the plurality of high-voltage electrical components 13 being mounted thereon, the UVW busbar 31, and the like into the resin structure 12 as a base member so as to be a subassembly, as illustrated in FIG. 4.

Then, the inverter unit 35 is housed within the inverter housing section 8 provided in the housing 2 (motor housing 3), and the cover 11 is mounted so that inverter unit 35 is sealed after the legs 20 of the resin structure 12 is tightly fixed with the screws 19. Thus, the inverter-integrated electric compressor 1 is configured so that the inverter unit 35 is removably incorporated within the inverter housing section 8.

As such, according to the present embodiment, the inverter device 7 incorporated within the inverter housing section 8 of the housing 2 includes the plurality of high-voltage electrical components 13 forming the noise removal filter circuit 16A, the power substrate 14 on which the power element 27 is mounted, the control substrate 15 on which the control circuit 30 is mounted, and the filter circuit substrate 16 forming the filter circuit 16A by the plurality of high-voltage electrical components 13 being connected to a pattern and mounted thereon, and is configured so that these components are integrally unitized, and housed and installed in the inverter housing section 8.

Therefore, the noise removal filter circuit 16A formed by the plurality of high-voltage electrical components 13 such as the common mode coil 21, the normal mode coil 22, the smoothing capacitor 23, and the like being connected onto the high-voltage power line is formed by the plurality of high-voltage electrical components 13 being connected to a pattern on the filter circuit substrate 16, the filter circuit substrate 16 is integrally unitized with the plurality of high-voltage electrical components 13, the power substrate 14, the control substrate 15, and the like, and is then incorporated into the inverter housing section 8 of the housing 2 (motor housing 3), thereby enabling the inverter-integrated electric compressor 1 to be assembled.

Accordingly, the filter circuit substrate 16 and the power substrate 14 of the high-voltage system are separate substrates from the control substrate 15, enabling the substrates to ensure current density corresponding to high voltage. In addition, this eliminates a busbar connection between the plurality of high-voltage electrical components 13 forming the filter circuit 16A, welding thereof, and the like, and realizes simplification of assembly, reduced man-hours and reduced manufacturing costs due thereto, which in turn makes it possible to improve productivity. Moreover, reducing the number of components enables the inverter device 7 to be made smaller and compact, which in turn enables the inverter-integrated electric compressor 1 to be made more compact and lightweight.

Moreover, the inverter device 7 includes the resin structure 12 integrally formed with the housing section 17 for the plurality of high-voltage electrical components 13, and the assembly section 18 for the plurality of substrates 14, 15, 16, and is configured so that the plurality of high-voltage electrical components 13, the power substrate 14, the control substrate 15, the filter circuit substrate 16, and the UVW busbar 31 are incorporated into the resin structure 12 and integrally unitized as the inverter unit 35.

Thus, this configuration enables the inverter unit 35 integrally unitized via the resin structure 12 to be integrally incorporated into the electric compressor 1 by tightly fixing the legs 20 of the resin structure 12 to the inverter housing section 8 with screws or the like, or enables the entire inverter unit 35 to be removed from the inverter housing section 8 by removing the screws 19. Consequently, this enables the assembly or maintenance of the inverter device 7 to be simplified and facilitated.

In addition, in the present embodiment, the inverter device 7 includes the UVW busbar 31 that outputs the power converted into the three-phase alternating current power by the unitized inverter device 7 toward the electric motor via the glass-sealed terminal 32. Thus, the power converted into three-phase alternating current power of the specified frequency by the unitized inverter device 7 is output from the UVW busbar 31 to the glass-sealed terminal 32, so that the power can be applied to the electric motor housed within the housing 2 (motor housing 3). The interposition of such a UVW busbar 31 ensures a degree of freedom in terms of layout between the output position of the unitized inverter device 7 and the glass-sealed terminal 32 provided within the inverter housing section 8, so that design can be simplified.

The power substrate 14 and the filter circuit substrate 16 are substrates having a common structure that can ensure current density corresponding to high voltage. Because, in the inverter device 7, the filter circuit substrate 16 and the power substrate 14 are common high-voltage substrates through which a large quantity of electricity flows, substrates having a common structure can be employed. Thus, the substrate material used for the power substrate 14 is applicable as-is to the filter circuit substrate 16, which enables a reduction in manufacturing costs for the filter circuit substrate 16.

Moreover, the power substrate 14 and the filter circuit substrate 16 are, for example, multi-layer structured substrates PWB having a four-layer structure or the like. As such, employing the multi-layer structured substrate PWB having a four-layer structure or the like for the power substrate 14 and the filter circuit substrate 16 of the high-voltage system enables sufficient current density corresponding to high voltage to be ensured by each of the substrates 14, 16. Thus, sufficient thermal resistance is ensured even in use under environment in which heat is generated by high voltage and large current or of environment of high temperature.

In addition, in the present embodiment, the power substrate 14 and the filter circuit substrate 16 be created from a common substrate material and be formed by the common substrate material being divided or split. Thus, taking two substrates from the common substrate material, that is, from the multi-layer structured substrate PWB having a four-layer structure or the like, enables the power substrate 14 and the filter substrate 16 of the high-voltage system to be manufactured as a set. Accordingly, the power substrate and the filter circuit substrate are efficiently manufactured, enabling cost reduction.

The present invention is not limited to the invention according to the embodiments as described above, and changes can be made as appropriate without departing from the gist thereof. For example, the above embodiment has the configuration wherein the housing section 17 of the resin structure 12, which houses the plurality of high-voltage components 13, is disposed facing the side surface on the intake port 4 side, but this configuration and disposition can be appropriately modified with a certain degree of freedom; e.g., a configuration wherein the housing section 17 is disposed facing the rear end surface of the motor housing 3.

Additionally, the above embodiment has the configuration wherein the high-voltage cable from a power supply is connected with the connector provided on the cover 11 side, and from which high-voltage is input to the inverter device 7, but it may have a configuration wherein high-voltage is input from the side surface of the inverter housing section 8, or the like.

REFERENCE SIGNS LIST

1 Inverter-integrated electric compressor
2 Housing
3 Motor housing
7 Inverter device
8 Inverter housing section
12 Resin structure
13 High-voltage electrical component
14 Power substrate
15 Control substrate
16 Filter circuit substrate
16A Filter circuit
17 Housing section
18 Assembly section
21 Common mode coil (high-voltage electrical component)
22 Normal mode coil (high-voltage electrical component)
23 Smoothing capacitor (high-voltage electrical component)
27 Power element
30 Control circuit
31 UVW busbar
32 Glass-sealed terminal
35 Inverter unit (unit)
PWB Multi-layer structured substrate

The invention claimed is:

1. An inverter-integrated electric compressor having an inverter device incorporated into and integrated with an inverter housing section, the inverter housing section being provided on an outer circumference of a housing, the inverter-integrated electric compressor comprising:

the inverter device including:
- a control substrate having a control circuit mounted thereon;
- a plurality of high-voltage electrical components forming a noise removal filter circuit, where a high-voltage electrical component is an electrical component operating, by power supplied from a power supply unit, under a voltage higher than a voltage under which the control circuit mounted on the control substrate operates;
- a power substrate having a power element mounted thereon;
- a filter circuit substrate having the plurality of high-voltage electrical components connected to a pattern and mounted thereon so as to form the filter circuit; and
- a resin structure, integrally formed with a housing section having a bottom and a volume required for housing and installing the plurality of high-voltage electrical components and an assembly section having a frame shape for assembling each of the substrates, with an empty space being provided in a center portion of the assembly section, connection terminals being insert-molded for electrically connecting each of the substrates in advance;

the assembly section including a support extending toward a center portion of the empty space of the assembly section, being integrally formed in the assembly section, and supporting the control substrate from below, the plurality of high-voltage electrical components, the power substrate, the control substrate, and the filter circuit substrate being assembled into the resin structure and integrally unitized to form the inverter device, the control substrate and the power substrate being assembled into the resin structure by being tightly fixed to assembly bosses, and the inverter device being removably housed and installed in the inverter housing section.

2. The inverter-integrated electric compressor according to claim 1, wherein
the inverter device includes the resin structure; and
the plurality of high-voltage electrical components are housed and installed in the housing section of the resin structure,
the power substrate is assembled on a bottom surface side of the assembly section of the resin structure,
the control substrate is assembled on a top surface side of the assembly section of the resin structure, and
the filter circuit substrate is assembled on a top surface side of the housing section of the resin structure having the plurality of high-voltage electrical components housed and installed therein, so that inverter device is integrally unitized.

3. The inverter-integrated electric compressor according to claim 2, wherein the inverter device includes a UVW bus bar configured to output power converted into three-phase alternating current power by the unitized inverter device to an electric motor side via a glass-sealed terminal.

4. The inverter-integrated electric compressor according to claim 1, wherein the power substrate and the filter circuit substrate each have a substrate structure capable of ensuring current density corresponding to an operating voltage of the plurality of high voltage components.

5. The inverter-integrated electric compressor according to claim 4, wherein the power substrate and the filter circuit substrate are multi-layer structured substrates.

6. The inverter-integrated electric compressor according to claim 4, wherein the power substrate and the filter circuit substrate are created from a common substrate material, and are formed by the common substrate material being divided or split.

* * * * *